United States Patent
Lohse et al.

(10) Patent No.: US 7,593,269 B2
(45) Date of Patent: Sep. 22, 2009

(54) DIFFERENTIAL FLASH MEMORY PROGRAMMING TECHNIQUE

(75) Inventors: Martin A. Lohse, Munich (DE); Kenneth A. Tuchman, Munich (DE)

(73) Assignee: Agere Systems Inc., Allentown, PA (US)

( * ) Notice: Subject to any disclaimer, the term of this patent is extended or adjusted under 35 U.S.C. 154(b) by 2 days.

(21) Appl. No.: 11/943,502

(22) Filed: Nov. 20, 2007

(65) Prior Publication Data
US 2008/0068894 A1 Mar. 20, 2008

Related U.S. Application Data

(63) Continuation of application No. 10/349,055, filed on Jan. 22, 2003, now Pat. No. 7,313,030.

(30) Foreign Application Priority Data
Jan. 29, 2002 (EP) ................................. 02002166

(51) Int. Cl.
*G11C 16/04* (2006.01)
(52) U.S. Cl. ........................... 365/185.33; 365/185.11; 365/185.09; 365/189.07

(58) Field of Classification Search ............ 365/185.33, 365/185.11, 185.09, 189.07
See application file for complete search history.

(56) References Cited

U.S. PATENT DOCUMENTS

| 6,141,256 | A | 10/2000 | Forbes |
| 6,882,567 | B1 | 4/2005 | Wong |
| 7,002,851 | B2 * | 2/2006 | Yamagami et al. ..... 365/185.33 |
| 7,283,397 | B2 | 10/2007 | Harari et al. |
| 7,313,030 | B2 * | 12/2007 | Lohse et al. ........... 365/185.33 |
| 2003/0142556 | A1 | 7/2003 | Lohse et al. |
| 2005/0063242 | A1 | 3/2005 | Ren |

* cited by examiner

*Primary Examiner*—Huan Hoang

(57) ABSTRACT

The invention relates flash memory programming techniques. An object of the invention is to provide a flash memory programming technique avoiding problems of the known state of the art and in particular, saving a significant amount of time during the development and/or production phases of any equipment containing flash memory devices and also saving time during an updating or upgrading procedure of such an equipment already being in use. Accordingly, the invention proposes for programming a flash memory device to program only differences in information between data already stored in the flash memory device and new data to be stored.

6 Claims, 1 Drawing Sheet a)

b)

DIFFERENTIAL FLASH MEMORY PROGRAMMING TECHNIQUE

CROSS REFERENCE TO RELATED APPLICATION

This application is a continuation of U.S. patent application Ser. No. 10/349,055, entitled "DIFFERENTIAL FLASH MEMORY PROGRAMMING TECHNIQUE," filed on Jan. 22, 2003, by Martin A. Lohse, et al., now U.S. Pat. No. 7,313,030 and is a continuation of EPO application 02002166.3, filed on Jan. 29, 2002. The above-listed application is commonly assigned with the present invention and is incorporated herein by reference as if reproduced herein in its entirety.

TECHNICAL FIELD OF THE INVENTION

The invention relates to a method for differentially flash memory programming, to a flash memory programming apparatus having such functionality and to a flash memory device processed by applying that functionality.

BACKGROUND OF THE INVENTION

Generally, flash memory devices are used widely because of their low costs and ability to retain data when power is shut off. Moreover, they are rewritable many times and use a block erase technique as opposed to EEPROM's. Consequently, flash memories devices are often used inside apparatuses for storing applications and/or other data, such as inside handhelds and cell phones.

However, the in-circuit programming of such flash memory devices by known conventional techniques requires at least approximately 2.5 minutes of programming time for each megabyte of data.

In particular, during the development of new applications or corresponding programs, during the production phases and/or even in case of the updating or upgrading of an existing application and/or implemented software, it is often the case that the respective program changes to be made are small relative to the entire flash size. Conventional flash programming techniques however, generally reprogram the entire flash device at one time or successively, for example sector after sector or block after block to which the flash memory device usually is divided. As a result, the rewriting or reprogramming of the flash memory device is slow no matter how small the actual change may be.

For example, current mobile phones contain flash memory devices up to four megabytes in size, which represents a total programming time during any development, production and/or upgrading phases of approximately ten minutes.

SUMMARY OF THE INVENTION

An object of the invention is therefore to provide a flash memory programming technique avoiding the discussed problems of the known state of the art and in particular, saving a significant amount of time during the development and/or production phases of any equipment containing flash memory devices and also saving time during an updating or upgrading procedure of such an equipment already being in use.

Accordingly, the invention proposes for programming a flash memory device to program only differences in information between data already stored in the flash memory device and new data to be stored.

Consequently, since in case of an information change or update only the differential information is newly programmed the total programming time is directly related to the amount of differences between the new data and the data already present in the flash memory device. As a result thereof, in particular, if the information changes in fact result in small differences with regard to the total flash size, a significant reduction of total programming time is ensured.

Preferably, it is further proposed that volatile information or volatile software components are stored at least near the end of the respective flash memory address space of the flash memory device to keep the need of changing or adjusting flash sectors, in particular with regard to necessary sizes and/or the amount, as slight as possible.

To further reduce such need of changing or varying flash sectors, according to a further preferred embodiment, it is proposed to store the differential information at least near the end of the respective flash memory address space of the flash memory device.

In addition or as an alternative, it is further proposed to store information least likely to be changed at least near the beginning of the respective flash memory address space of the flash memory device.

According to a further refinement, the placing of stored information and/or information to be stored, in particular even a determinable placing thereof, is supervised preferably by means of an appropriate adapted software linker means, in particular to improve the flexibility during succeeding phases of a development process.

Preferably, for ensuring an accurate data comparison between the new data to be programmed with that already present in the flash memory device to detect the differences in information, a cyclic redundancy check is employed, in particular by using correspondingly adapted logical comparing means.

Correspondingly, the invention is further providing a flash memory programming apparatus adapted to employ the inventive functionality and preferably comprising means for selectively erasing and/or reprogramming a sector having a difference in the embedded data with regard to the respective new or updated data to be stored. Moreover, the invention is covering a flash memory device processed by such functionality and a software implementation product adapted to perform that inventive method.

BRIEF DESCRIPTION OF THE DRAWING

Subsequently, the invention is described in more detail with regard to a preferred embodiment and based on the accompanied drawing, in which.

DETAILED DESCRIPTION

A plurality of further software projects or applications and hence, a plurality of flash memory devices such as flash memory chips, contain a significant amount of libraries and constant data that almost never will be changed. On the other hand side however, certain software sections, especially during a development and/or production phase and/or due to an updating or upgrading process, will change greatly and hence forming volatile information or software components stored in flash memory devices.

Regarding FIGS. 1a and 1b, an exemplar flash memory chip divided in several addressable sectors or blocks 101 . . . 107 with information or software components respectively embedded therein is schematically depicted. A current mobile phone for example, contain such flash memory chips with an entire size of up to four megabytes. Thus, in case of an information change, for example during the development and/or production phase because of the detection of errors or problems in some of the software components, a total programming process for changing the entire data or information stored would result in an programming time for each mobile phone of approximately ten minutes.

According to the inventive approach however, in particular by programming only the differences in information between the new data and the data already stored in the flash device, software changes which generally result in small differences in flash data, require only a few seconds to program.

Based thereon, volatile software components are physically arranged preferably at least near the end of the respective flash memory address space of a flash memory device and the least likely to change components are preferably placed near the beginning.

Figure 1:
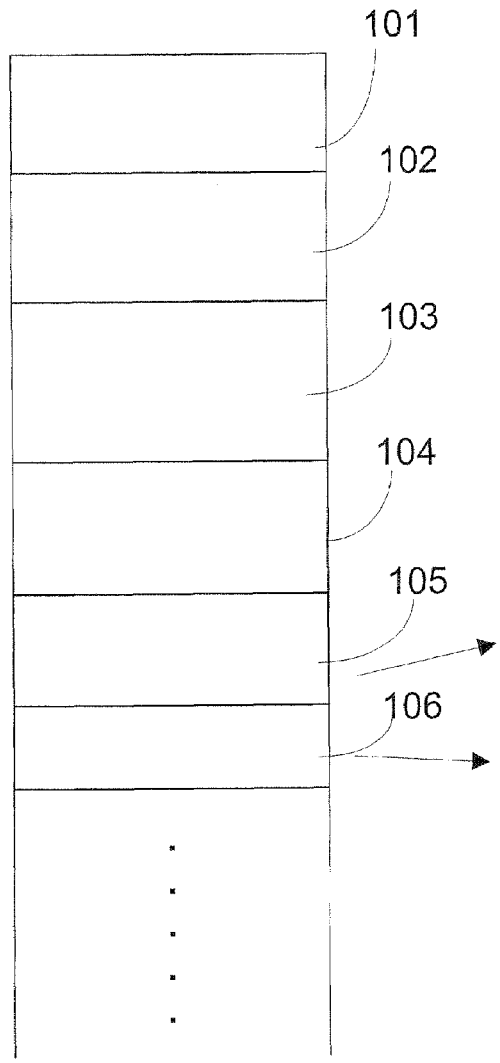
FIG. 1a is schematically depicting an exemplar arrangement of sectors of a flash memory chip depending on the likelihood of changing of the respective data embedded therein prior to performing an information change.
FIG. 1b is schematically depicting the exemplar arrangement of FIG. 1a after an information change.
Figure 1:
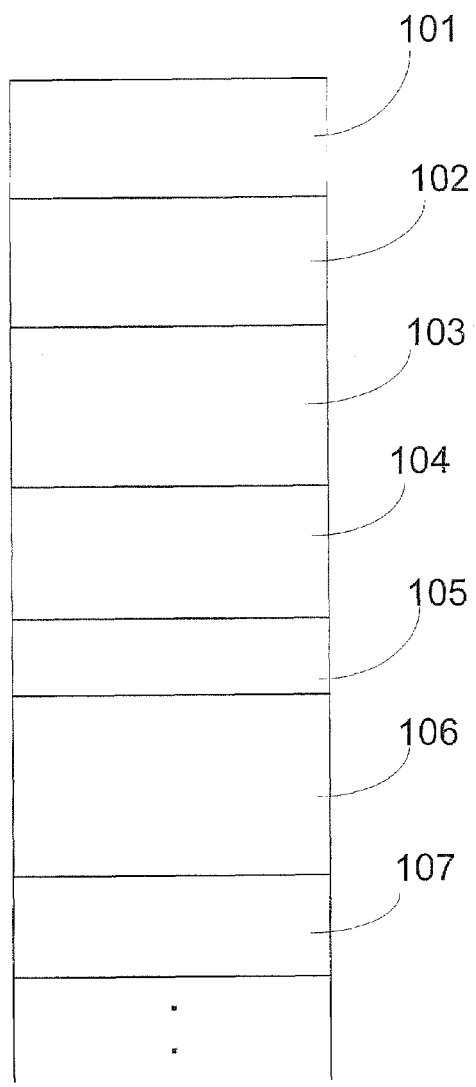

Referring to FIGS. 1a and 1b in more detail, FIG. 1a is schematically depicting the exemplar flash memory chip prior to performing a software change. Based on FIG. 1, information components least likely to be changed are placed or stored at the beginning of the respective flash memory address space, for example in the depicted sectors 101 to 104. Within the sectors 105 and 106 and possibly following sectors, information components are embedded which will be changed greatly.

As mentioned above, during a development and/or production phase such volatile information or software components are fraught with problems, for example. If the flash memory chip is already in use, for example inside a mobile phone, such volatile information components may comprise stored addresses or other applications which depend on actual standards.

If a problem or error is detected and identified or an application has to be upgraded due to a new standardisation, the information components already stored in the flash memory device, i.e. within the sectors 101 to 106 is compared with the respective new information or updated set of data. This is performed preferably by using a correspondingly adapted logical comparator of an associated programming apparatus, as known in general by person skilled in the art. To ensure that the data comparison is always accurate such logical comparator preferably employs a cyclic redundancy check (CRC).

If the logical comparator is identifying an information difference in sectors 105 and 106 of the flash memory chip of FIG. 1, then only these two sectors 105 and 106 are erased and newly written as indicated by the depicted arrows, without the need of changing the preceding sectors 101 to 104. Moreover, since the flash memory chip prior to the information change (FIG. 1a) has still memory address space left, a new succeeding sector 107 can be defined and written to add a differential or completely new information component without the need of changing the preceding sectors 101 to 104.

The arrangement after such an information change and/or adding is schematically depicted in FIG. 1b.

As can be seen from FIG. 1b, the sizes of the information components within the sectors 105 and 106 after the information change are different in comparison to the situation prior to the information change, as depicted in FIG. 1a. In particular, the exemplar information change has reduced the amount of the set of data embedded in sector 105 but has enlarged the amount of the set of data embedded in the sector 106.

Accordingly, if the volatile information component embedded in sector 105 would have been embedded for example, in sector 103 prior to the information change, then after the information change flash memory address space would be unused and wasted except when the entire flash memory device is reprogrammed to correspondingly adjust the sector sizes. Similar thereto, if the volatile information component embedded in sector 106 would have been embedded for example, in sector 104 prior to the information change, then all of the succeeding sectors should be changed or newly adjusted, i.e. erased and newly written, since the information change causes an enlargement of that volatile information component stored in sector 106. As it is obvious for a person skilled in the art, a same or corresponding consequence due to the information change should be applied to the information component newly added in sector 107 having a very high address in case of adding such information component within a sector having a lower address.

It is mentioned, that the placement or ordering of the respective software components may be controlled by the respective associated software linker, which may supervise a pre-determinable placing of a stored information component or information component to be stored, in particular depending on its likelihood of changing. Consequently, the information components according to FIG. 1b may be additionally or subsequently re-ordered, in particular depending on a variation in the likelihood of changing the respective information components.

As it is obvious for person skilled in the art, the inventive approach is not restricted to the example of a mobile phone containing flash devices. In general any product and/or application that requires in-circuit reprogramming of flash memory devices may use the inventive approach for programming flash memories such that the programming time is directly related to the amount of differences between the data already present in the flash and the new data to be stored.

What is claimed is:

1. A flash memory programming apparatus, comprising:
means having a logic for comparing embedded data presently stored in a flash memory device and new or updated data to be stored or programmed in that flash memory device to identify differences in information between the embedded data and the respective new or updated data to be stored or programmed therein;
means for selectively erasing and/or programming only a sector having the differences in information in the embedded data with regard to the respective new or updated data;
means having a logic for programming an erased sector with the respective new or updated data;
means having a logic for supervising the placing of stored information or information to be stored in the flash memory device; and
means for storing information least likely to be changed at an address near the end of the respective flash memory address space of the flash memory device.

2. A flash memory programming apparatus according to claim 1 further comprising a linker means for controlling the ordering of data to be stored within sectors of the flash memory device.

3. A flash memory programming apparatus according to claim 1 further comprising means for performing a cyclic redundancy check for ensuring an accurate data comparison.

4. A flash memory programming apparatus according to claim 1 wherein the programming changes an amount of data in the erased sector.

5. A flash memory programming apparatus, comprising:

means having a logic for comparing embedded data presently stored in a flash memory device and new or updated data to be stored or programmed in that flash memory device to identify differences in information between the embedded data and the respective new or updated data to be stored or programmed therein;

means for selectively erasing and/or programming only a sector having the differences in information in the embedded data with regard to the respective new or updated data;

means having a logic for programming an erased sector with the respective new or updated data;

means having a logic for supervising the placing of stored information or information to be stored in the flash memory device; and means for defining a new succeeding sector of the flash memory device and programming the new succeeding sector with the respective new or updated data.

6. A flash memory programming apparatus, comprising:

means having a logic for comparing embedded data presently stored in a flash memory device and new or updated data to be stored or programmed in that flash memory device to identify differences in information between the embedded data and the respective new or updated data to be stored or programmed therein;

means for selectively erasing and/or programming only a sector having the differences in information in the embedded data with regard to the respective new or updated data;

means having a logic for programming an erased sector with the respective new or updated data;

means having a logic for supervising the placing of stored information or information to be stored in the flash memory device; and means for storing information least likely to be changed at an address near the beginning of the respective flash memory address space of the flash memory device.

* * * * *